United States Patent
Yano et al.

(10) Patent No.: US 6,583,506 B1
(45) Date of Patent: Jun. 24, 2003

(54) SEMICONDUCTOR DEVICE

(75) Inventors: Takakazu Yano, Tokyo (JP); Shigeru Morokawa, Higashiyamoto (JP); Takashi Masuda, Tokorozawa (JP); Makoto Watanabe, Tokorozawa (JP); Masayoshi Kikuchi, Sayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/622,837

(22) PCT Filed: Feb. 25, 1999

(86) PCT No.: PCT/JP99/00892

§ 371 (c)(1),
(2), (4) Date: Aug. 24, 2000

(87) PCT Pub. No.: WO99/44228

PCT Pub. Date: Sep. 2, 1999

(30) Foreign Application Priority Data

| Feb. 25, 1998 | (JP) | ............ 10-043140 |
| Oct. 2, 1998 | (JP) | ............ 10-280747 |

(51) Int. Cl.[7] .................................. H01L 23/48
(52) U.S. Cl. ........................ 257/737; 257/778
(58) Field of Search ................. 257/780, 737, 257/738, 778

(56) References Cited

U.S. PATENT DOCUMENTS

| 4,188,438 A | * | 2/1980 | Burns | ............ 428/209 |
| 4,661,375 A | | 4/1987 | Thomas | ............ 427/89 |
| 5,084,752 A | | 1/1992 | Satoh et al. | ............ 357/68 |
| 5,134,460 A | | 7/1992 | Brady et al. | ............ 357/71 |
| 5,470,787 A | * | 11/1995 | Greer | ............ 437/183 |

FOREIGN PATENT DOCUMENTS

| EP | 0 395 072 A2 | 10/1990 |
| JP | 58-115860 | 7/1983 |
| JP | 9-129648 | 5/1997 |
| JP | 9-330932 | 12/1997 |

* cited by examiner

*Primary Examiner*—Roy Potter
(74) *Attorney, Agent, or Firm*—Armstrong, Westerman & Hattori, LLP

(57) ABSTRACT

A bump of a semiconductor device is made up of an aluminum layer formed by sputtering. The height of the projecting terminal is sufficiently higher than those of the other parts, and the uppermost surface of the bump is covered with a conductive film preventing oxidation of films, such as a transparent conductive film.

11 Claims, 15 Drawing Sheets

F I G. 9A
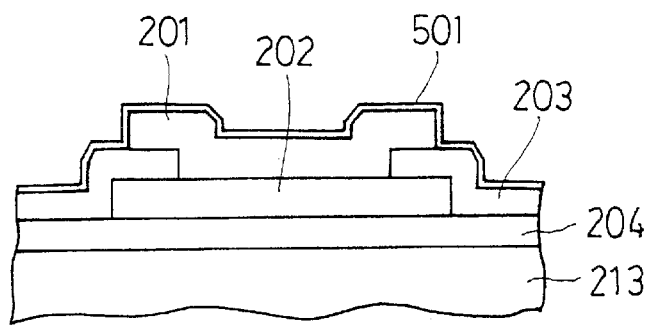
F I G. 9B
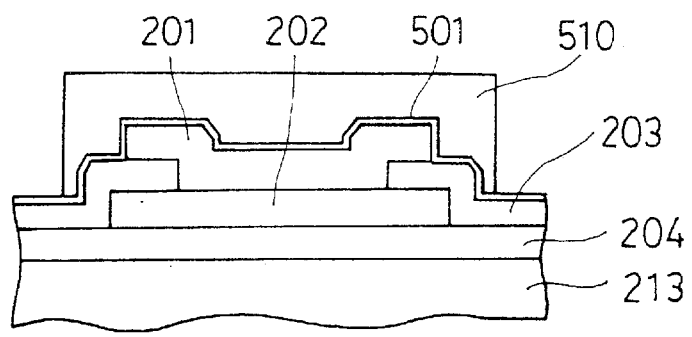
F I G. 9C
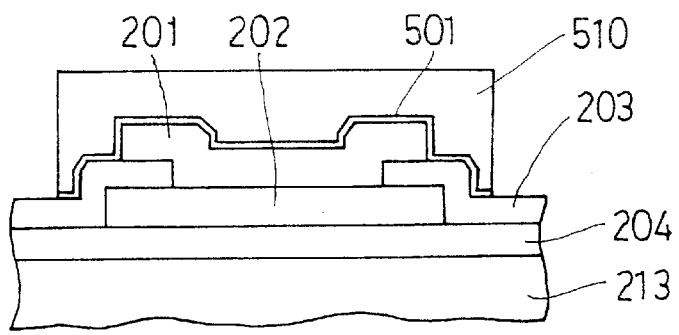
F I G. 9D
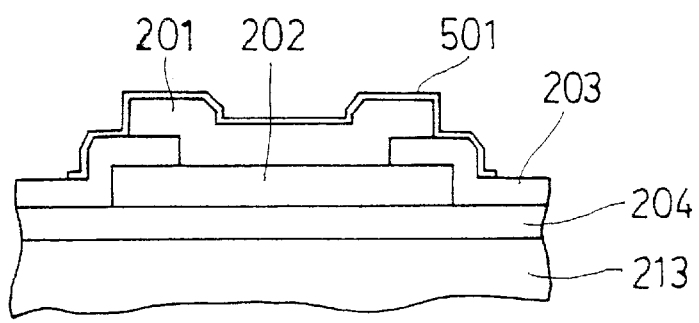

SEMICONDUCTOR DEVICE

TECHNICAL FIELD

This invention relates to a semiconductor device comprising bumps that are suitable for mounting on a circuit board with an anisotropic conductive film therebetween.

BACKGROUND TECHNOLOGY

Recently, a semiconductor device for surface mounting comprising bumps (projecting terminals) capable of electrically and mechanically connecting to a circuit board has been often used.

The structure of the bump in such a conventional semiconductor device and a fabricating method thereof will be briefly described with reference to FIG. 14A to FIG. 14D. Incidentally, these drawings are sectional views, but oblique lines showing sections are omitted.

FIG. 14D shows a section of the bump and thereabout of a complete semiconductor device.

On the surface of a silicon wafer 213 which is cut into semiconductor chips, a selective oxide (LOCOS) film 204 which is a layer necessary for fabricating a semiconductor device is provided, and an aluminum layer 702 is provided on the selective oxide (LOCOS) film 204. This aluminum layer 702 is a layer necessary to input and output a power supply or a signal to/from interconnections in the semiconductor device and an integrated circuit from/to the outside.

On top of that, a passivation film 703 which is an insulation protection film covering the entire face of the silicon wafer 213 is provided, and an opening portion 703a is formed in the passivation film 703 on the aluminum layer 702. A gold bump 701 which is mushroom shaped is provided from the aluminum layer 702 within the opening portion 703a extending onto the passivation film 703 around the opening portion 703a with a noble metal film 705 therebetween.

In this drawing, only one bump is shown, but many bumps are provided in a real semiconductor chip.

FIG. 14A to FIG. 14C are views showing the mid-steps of the fabrication of this semiconductor device.

As shown in FIG. 14A, the selective oxide film 204 is formed on the silicon wafer 213, and the aluminum layer 702 which is connected to the internal integrated circuit is formed at a necessary position on the selective oxide film 204. The passivation film 703 which covers the entire face of the silicon wafer 213 including the aluminum layer 702 is formed, and the opening portion 703a for establishing connection with the outside is formed on the aluminum layer 702.

Then, as shown in FIG. 14B, the noble metal film 705 is formed on the entire faces of the passivation film 703 and the aluminum layer 702, and further a photosensitive resist 710 is selectively (except for a bump formation region) formed on the noble metal film 705.

The noble metal film 705 is a noble metal layer such as an alloy of titanium and tungsten, or the like and has a function as an electrode for producing the gold bump 701, which is formed on the aluminum layer 702 in a subsequent step, by electro-plating, and another function of improving the connection between the aluminum layer 702 and the gold bump 701.

This noble metal film 705 is formed by being laminated on the entire surface in a vacuum apparatus.

Next, as shown in FIG. 14C, a gold layer is produced in a portion in which the resist 710 is not formed by the electro-plating step to form the gold bump 701 which is the mushroom shaped bump electrode.

Then, after the resist 710 is removed, the noble metal layer 705 is removed with the gold bump 701 as a mask with only a portion thereof under the gold bump 701 left. FIG. 14D is a sectional view of this state.

Through such process steps, the bump electrodes of the gold bumps 701 are formed on the silicon wafer 213, and the silicon wafer 213 is cut into discrete semiconductor chips to complete semiconductor devices.

However, in the semiconductor device comprising such conventional bumps, since a plating process which is hard to manage is employed for making up the bumps, the bumps are prone to be nonuniform in height, and additionally, the use of costly gold for the material of the bumps results in a high cost of production.

The present invention is made to solve such problems and its object is to make it possible to easily fabricate bump electrodes of a semiconductor device at low cost and to make the height of the bumps uniform.

Moreover, another object is to make it possible that the height of a most projecting end face of the bump is sufficiently higher than those of projecting faces of any other parts of the semiconductor device in order that the bump can be surely electrically connected to an interconnection on a circuit board when such a semiconductor device is mounted on the circuit board with an anisotropic conductive film therebetween, and that an effective area of the end face is made large to catch a plurality of conductive particles.

DISCLOSURE OF THE INVENTION

To achieve the above object of the present invention, a semiconductor device comprising a polysilicon layer used for an interconnection and a gate of a transistor, an insulation layer covering thie polysilicon layer, an interconnection conductor layer formed on the insulation layer, and a bump for inputting and outputting a power supply or a signal to an integrated circuit, on the surface of a semiconductor chip in which the integrated circuit is formed, is structured as follows.

A polysilicon film and an insulation film made of the same materials as those of said polysilicon layer and said insulation layer are provided at a region at which the bump is formed, on the surface of the semiconductor chip; a first conductor which covers the insulation film and is electrically connected to the interconnection conductor layer is made of the same material as that of the interconnection conductor layer by sputtering; a protection insulation film which covers the surfaces of the first conductor, the interconnection conductor layer, and the semiconductor chip and in which an opening portion is provided on the first conductor is formed; a second conductor which conducts to the first conductor through the opening portion is formed on the protection insulation film by sputtering.

Further, the bump is composed of the polysilicon film, the insulation film, the first conductor, and the second conductor, and is formed so that a height of a most projecting end face thereof from the surface of the semiconductor chip is higher than those of projecting faces of any other parts.

Also in this case, each of the aforesaid first conductor and the second conductor can be made of aluminum.

Moreover, it is preferable that the most projecting end face of the bump is covered with a conductive film for preventing surface oxidation, that is, a conductive oxidation film or a noble metal film.

In the case where the aforesaid bump is composed of the aforesaid first conductor and the second conductor which conducts to the first conductor through the opening portion formed in the protection insulation film covering the first conductor, the film thickness of the protection insulation film at the region under the second conductor is formed thicker than that of the other region, thereby increasing the bump's height.

Further, in the present invention, a semiconductor device comprising a bump, on the surface of a semiconductor chip in which an integrated circuit is formed, for inputting and outputting a power supply or a signal to the integrated circuit and mounted on a substrate with an anisotropic conductive film containing a large number of conductive particles therebetween is structured as follows.

On the surface of the semiconductor chip, a first conductor which is electrically connected to the integrated circuit; a protection insulation film which covers the surfaces of the first conductor and the semiconductor chip and in which a through hole is formed on the first conductor; and a second conductor which is formed on the protection insulation film by sputtering and conducts to the first conductor through the through hole, are provided, wherein the bump is composed of the first conductor and the second conductor, and is formed so that a height of a most projecting end face thereof from the surface of the semiconductor chip is higher than those of projecting faces of any other parts by an error in diameter of the large number of conductive particles contained in the anisotropic conductive film or more.

It is desirable that a maximum opening dimension of the through hole formed in the protection insulation film is within 1.5 times a minimum diameter of the large number of conductive particles contained in the anisotropic conductive film.

Moreover, it is acceptable that the through hole formed in the protection insulation film is composed in shape of a square, a rectangle, a polygon, a circle, or an ellipse, or a plurality of through holes in these different shapes.

The second conductor is formed in an area larger than a region within which a step is formed at the protection insulation film caused by a step of the first conductor, thereby increasing an effective area of the most projecting end face of the bump.

BRIEF DESCRIPTION OF DRAWINGS

FIG. 9A to FIG. 9D are sectional views showing the surface processing steps of the bump in a fifth embodiment of the semiconductor device according to the present invention;

BEST MODE FOR CARRYING OUT THE INVENTION

In order to describe this invention in more detail, preferred embodiments of this invention will be explained using the drawings.

First Embodiment

FIG. 1 and FIG. 2A to FIG. 2F

Figure 1:
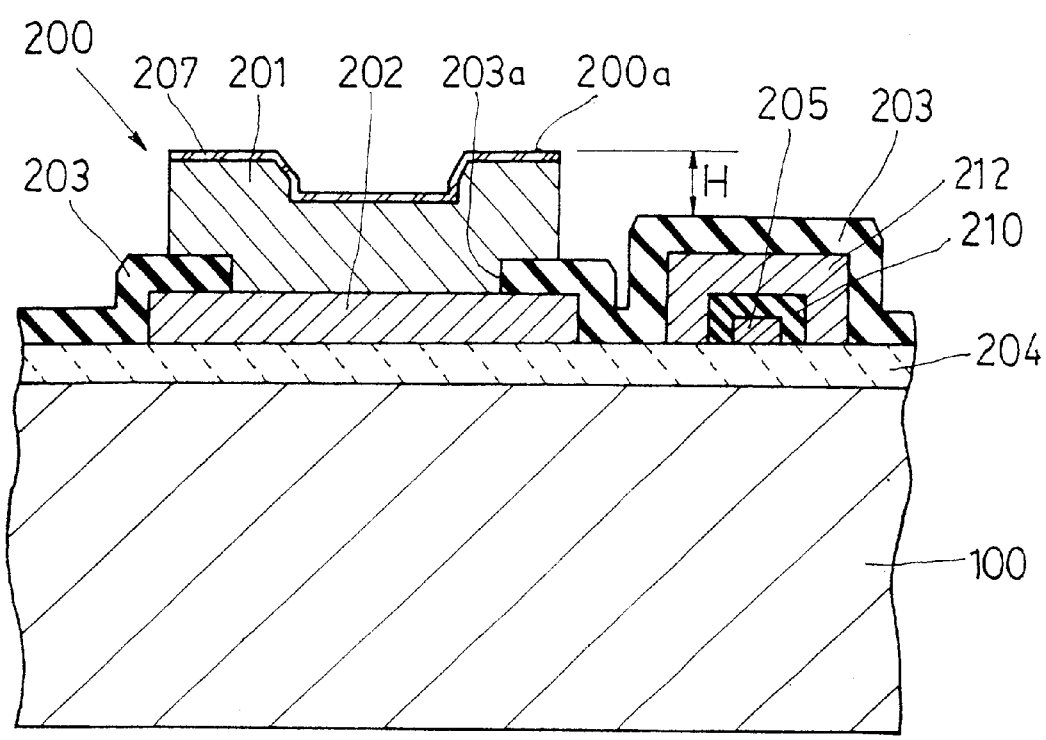
FIG. 1 is a sectional view of a bump and thereabout having a two-layered aluminum structure showing a first embodiment of a semiconductor device according to the present invention.

FIG. 1 is a sectional view showing only a bump and thereabout of the first embodiment of the semiconductor device according to the present invention.

In this semiconductor device, a selective oxide (LOCOS) film 204 is formed on the surface of a semiconductor chip 100. The selective oxide film 204 is an oxide layer of the surface of a silicon wafer before being cut into semiconductor chips, formed by heat treatment, and it is a layer necessary to fabricate the semiconductor device. It should be noted that an integrated circuit comprising many active elements such as transistors and the like, passive elements such as capacitors, resistors, and the like, and interconnections for connecting them is formed in this semiconductor chip 100 though the illustration thereof is omitted.

On the selective oxide film 204, a first aluminum layer 202 which is a first conductor to be an electrode pad for inputting and outputting a power supply and a signal from the outside is formed. An aluminum layer 212 is a layer of aluminum for the interconnections in the semiconductor device and is formed by being deposited in a vacuum apparatus simultaneously with the first aluminum layer 202 and thereafter patterned. The aluminum layers 202 and 212 normally have a thickness of about 1 micron ($\mu$m).

A polysilicon layer 205 is an interconnection of the semiconductor device and is formed by being deposited in the vacuum apparatus, and normally has a thickness of about 0.5 micron ($\mu$m).

An insulation layer 210 is an insulation film formed on the polysilicon layer 205, and is formed by heat treatment of the polysilicon layer 205, and normally has a thickness of about 0.5 micron ($\mu$m).

A passivation film 203 is a protection insulation film formed for the sake of protecting the elements in the semiconductor device.

The passivation film 203 is formed by being deposited in the vacuum apparatus and normally has a thickness of about 0.8 micron (μm). An opening portion 203a is formed in the passivation film 203 on the first aluminum layer 202.

A second aluminum bump 201 is a conductor which forms a bump 200 and is formed within the opening portion 203a in the passivation film 203 by sputtering in the vacuum apparatus, and conducts to the first aluminum layer 202 via the opening portion 203a and has a thickness of about 2 micron (μm).

The height of a most projecting end face 200a of the bump 200 from the surface of the semiconductor chip 100 is a value of the sum of the thickness of the first aluminum layer 202, the thickness of the passivation film 203, and the thickness of the second aluminum bump 201, and is higher than a value of the sum of the thicknesses of the passivation film 203, the polysilicon layer 205, the insulation layer 210, and the aluminum layer 212, which is a projecting face of the other part, only by a dimension shown by an H in FIG. 1. The difference H in height is at least about 1 micron (μm).

FIG. 2A to FIG. 2F are sectional views of the opening portion and thereabout in the passivation film 203, showing the steps of making up the bump of the semiconductor device shown in FIG. 1, but oblique lines showing sections are omitted.

Figure 2A:
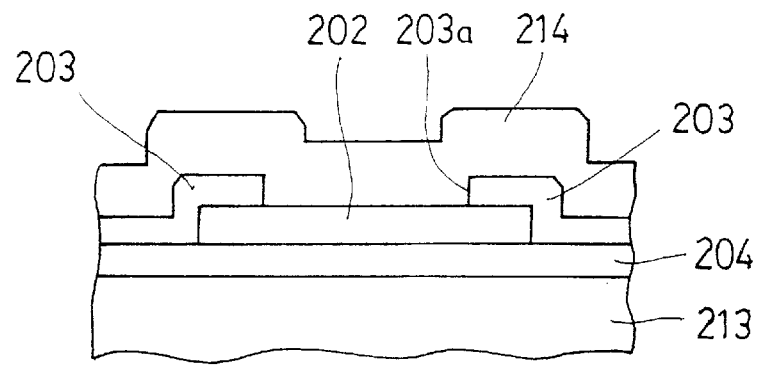
FIG. 2A to FIG. 2F are sectional views showing the fabricating steps of the bump of the semiconductor device.

FIG. 2A shows a state where the selective oxide (LOCOS) film 204 and an integrated circuit (not shown) are formed on a silicon wafer 213, and the first aluminum layer 202 and the passivation film 203 having the opening portion 203a are formed, and then processing (back sputter processing) which removes the oxide film formed on the aluminum layer 202 at the opening portion 203a through the agency of argon atoms in the vacuum apparatus by sputtering or the like, and thereafter a second aluminum layer 214 is continuously formed on the entire face by a sputtering apparatus.

Figure 2B:
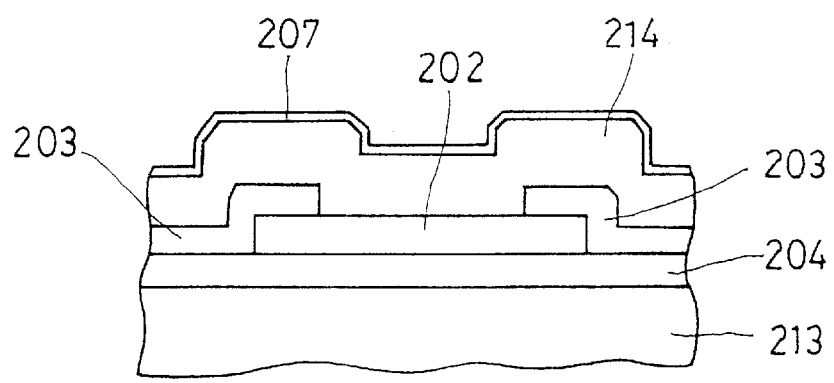

FIG. 2B shows a state where a transparent conductive film 207 which is a conductive film for preventing surface oxidation is formed on the entire face of the second aluminum layer 214. This transparent conductive film 207 can be made of indium tin oxide (ITO), and it is also suitable to use a noble metal such as gold, or copper, titanium, tantalum, or the like as the conductive film for preventing surface oxidation.

Figure 2C:
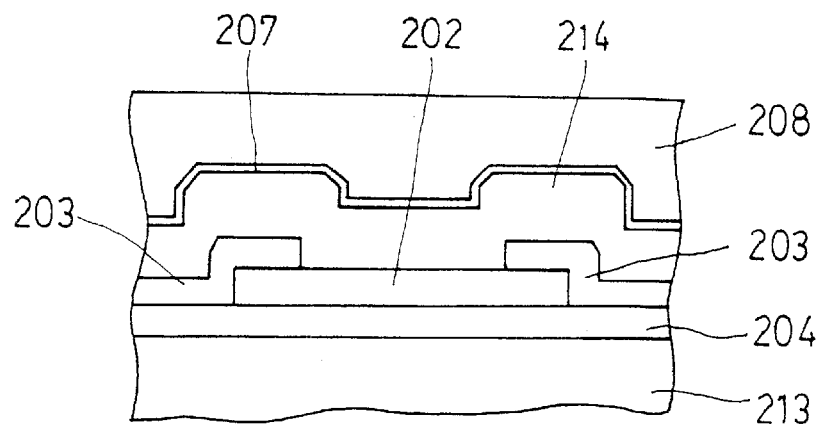
Figure 2D:
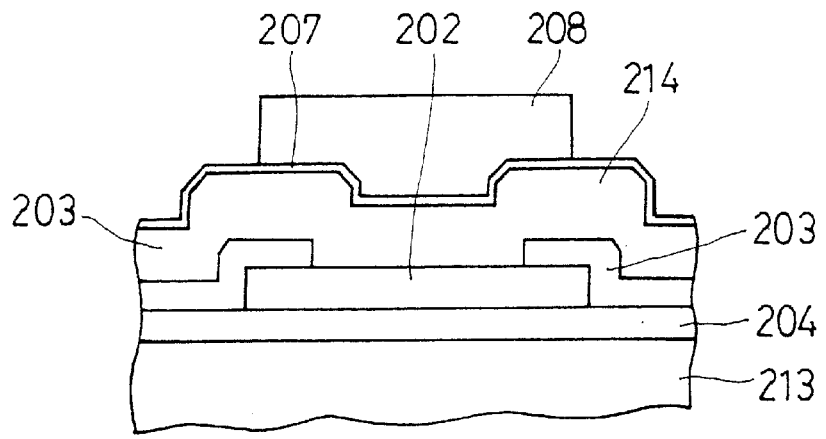

Then, as shown in FIG. 2C, a photosensitive resist 208 is applied on the entire face of the second aluminum layer 214 on which the transparent conductive film 207 is formed and then patterned by exposure with a metal mask, resulting in the state shown in FIG. 2D.

Figure 2E:
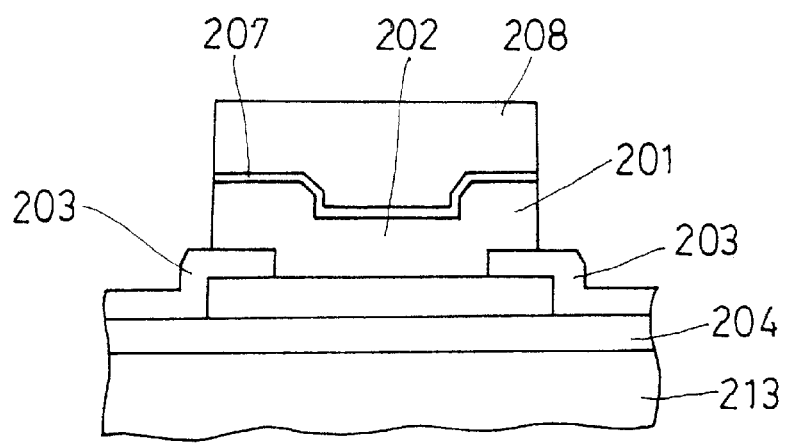

As shown in FIG. 2E, the transparent conductive film 207 and the second aluminum layer 214 are patterned by etching by means of a vacuum etching apparatus with the resist 208 as a mask to form the second aluminum bump 201 which is a second conductor.

Figure 2F:
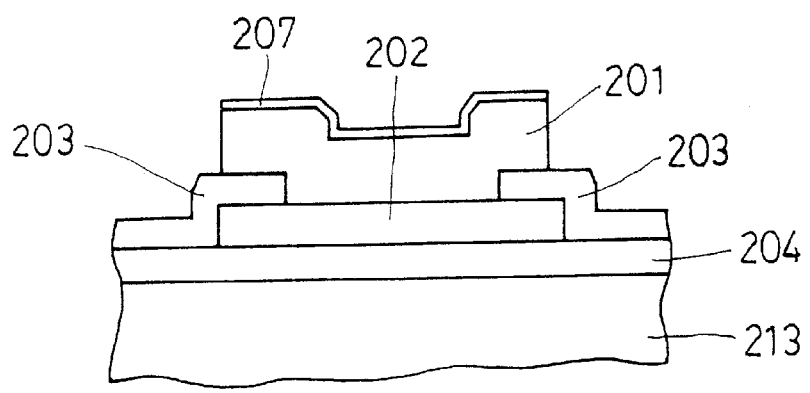

The state where the resist 208 is removed thereafter is shown in FIG. 2F. Then, the silicon wafer 213 is cut into individual semiconductor chips 100, thereby completing the semiconductor device comprising the bumps 200 shown in FIG. 1.

The structure of the bump 200 of this semiconductor device is a structure that can be easily formed in the fabrication process of an ordinary semiconductor device.

Here, in place of aluminum used for the first and second conductors in this embodiment, a conductor such as gold, copper, titanium, tantalum, or the like may be used.

Second Embodiment

FIG. 3 and FIG. 4A to FIG. 4F

Figure 3:
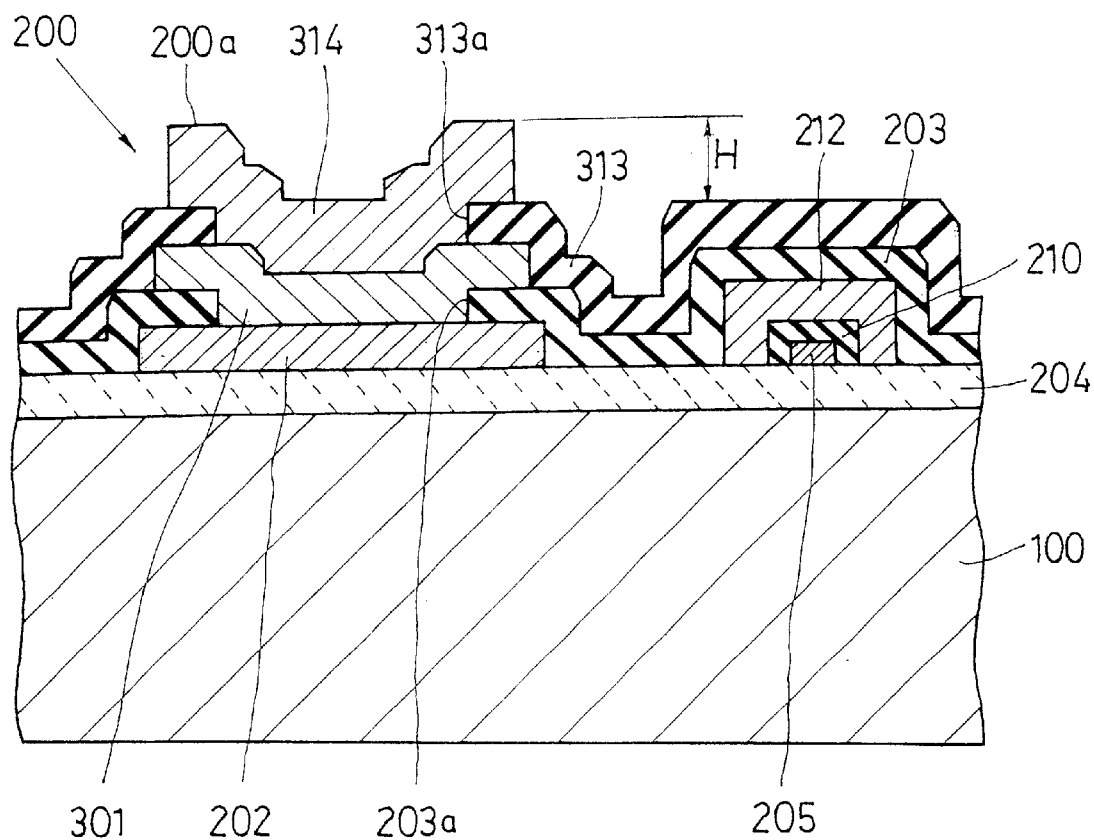
FIG. 3 is a sectional view of a bump and thereabout having a three-layered aluminum structure showing a second embodiment of the semiconductor device according to the present invention.

FIG. 3 is a view similar to FIG. 1, showing the second embodiment of the semiconductor device according to the present invention, and the same numerals and symbols are given to portions corresponding to those in FIG. 1 and the description thereof is omitted.

In this embodiment, a third aluminum bump 314 is further provided on the structure shown in FIG. 1 to form a bump 200 for the sake of making a difference H in height of the bump 200 larger than that in the semiconductor device shown in FIG. 1.

In other words, in this semiconductor device, a second aluminum bump 301 which is a second conductor is provided on a passivation film 203 and an opening 203a, and a second passivation film 313 provided with an opening portion 313a on the second aluminum bump 301 is formed on the passivation film 203.

Then, the third aluminum bump 314 conducting to the second aluminum bump 301 via the opening portion 313a of the second passivation film 313 is provided on the second passivation film 313 to make up the bump 200.

Accordingly, the height of a most projecting end face 200a of the bump 200 is a value of the sum of the thickness of a first aluminum layer 202, the thickness of the passivation film 203, the thickness of the second aluminum bump 301, the thickness of the second passivation film 313, and the thickness of the third aluminum bump 314. On the other hand, the height of the projecting face of an interconnection portion is a value of the sum of the thicknesses of the passivation film 203, a polysilicon layer 205, an insulation layer 210, an aluminum layer 212, the passivation film 203, and the second passivation film 313, and the difference H in height is larger than that in the semiconductor device shown in FIG. 1.

This structure can be obtained by forming the second passivation film 313 and the third aluminum bump 314 on the second aluminum bump 301 in the same process as that shown in the first embodiment.

FIG. 4A to FIG. 4F are views showing the steps of fabricating the bump of the semiconductor device of this embodiment.

Figure 4A:
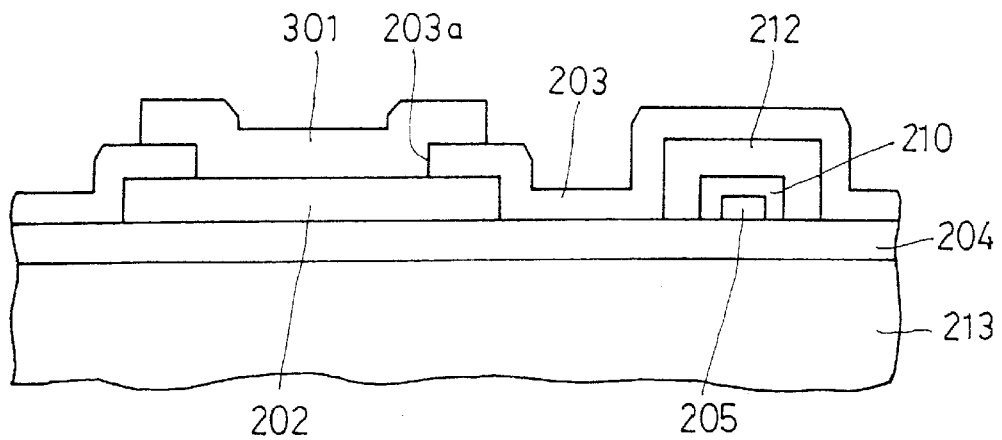
FIG. 4A to FIG. 4F are sectional views showing the fabricating steps of the bump of the semiconductor device.

FIG. 4A is a view showing the sectional structure fabricated in the same process as that described in the aforesaid first embodiment, in which in place of the second aluminum bump 201 in the first embodiment, the second aluminum bump 301 which is thinner in thickness than the second aluminum bump 201 is formed. This is because of relaxation of stress of the aluminum thin film and cost reduction.

Figure 4B:
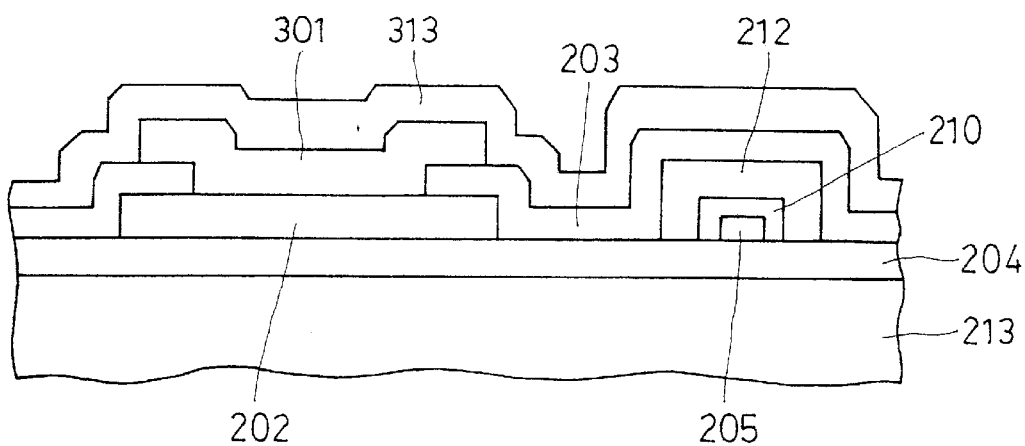

FIG. 4B shows a state where the second passivation film 313, which is a protection insulation film, is formed by being laminated on the entire face of the state in FIG. 4A.

The second passivation film 313 is made of the same material and nearly the same in thickness as the passivation film 203.

Figure 4C:
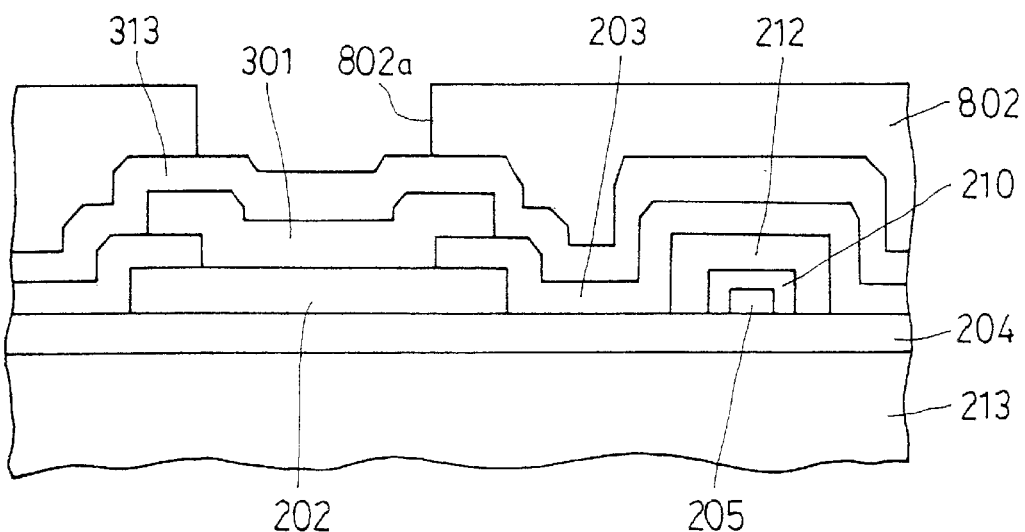

Thereafter, a photoresist 802 is applied on the entire face of the second passivation film 313 and patterned to form an opening portion 802a at a bump formation region on the second aluminum bump 301 as shown in FIG. 4C.

Figure 4D:
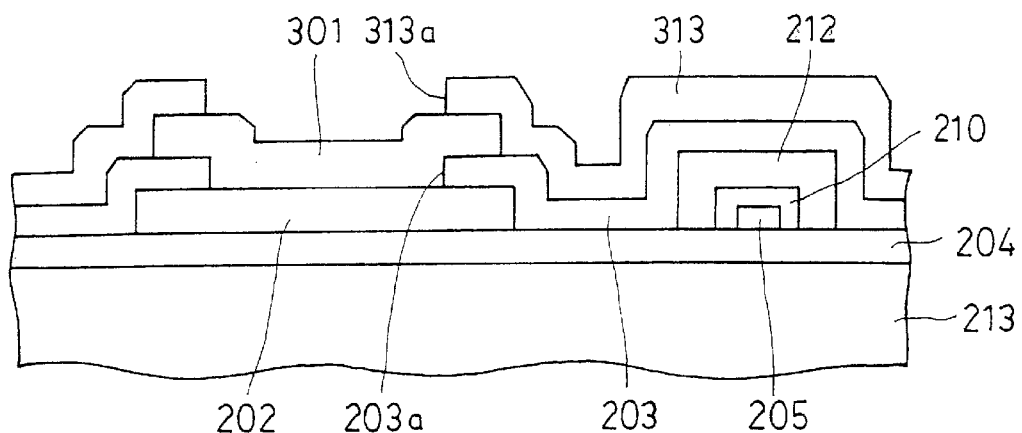

Then, as shown in FIG. 4D, a portion of the second passivation film 313 within the opening portion 802a is removed by etching with the photoresist 802 as a mask to form an opening portion 313a at the bump formation region.

Figure 4E:
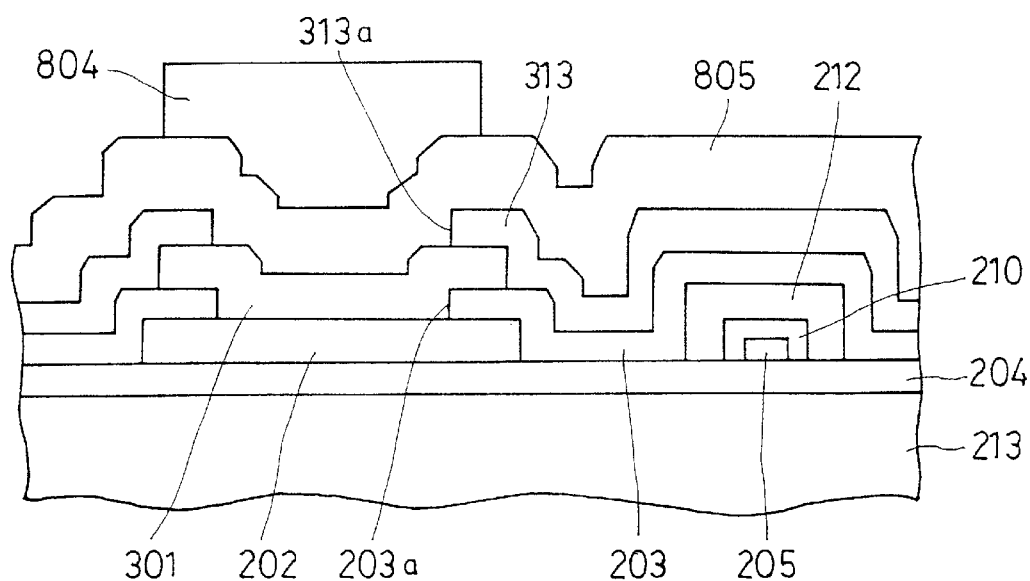

Moreover, a third aluminum layer 805 is formed on the entire face of the second passivation film 313 including the inside of the opening portion 313a, and a photoresist 804 is applied and then patterned to remain only at the bump formation region, resulting in the state shown in FIG. 4E.

When the third aluminum layer 805 is formed, an oxidation film is often formed on the surface of the second aluminum layer 301 which is exposed within the opening portion 313a of the second passivation film 313, thus it is desirable to remove the oxide film by performing back-sputtering in a vacuum.

Figure 4F:
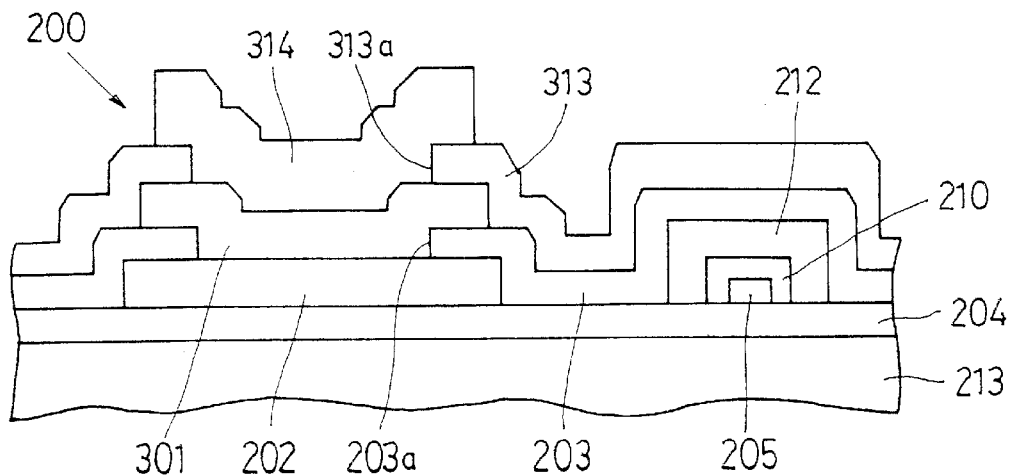

Then, the third aluminum layer 805 is etched with the photoresist film 804 as a mask to form the third aluminum bump 314 as shown in FIG. 4F, thereby completing the bump 200. Thereafter, the silicon wafer 213 is cut and divided into individual semiconductor chips 100, whereby the semiconductor device shown in FIG. 3 is completed.

The structure of the bump 200 in this embodiment is also a structure that can be easily formed in the fabrication process of an ordinary semiconductor device.

Here, in this embodiment, since aluminum is used as the first, second, and third conductors, they can be fabricated at low cost, but if the end face of the bump is oxidized, electrical connection resistance thereof with the circuit board side increases when it is mounted on the circuit board. Therefore, it is suitable to form, for example, a transparent conductive film made of ITO or a noble metal film made of gold or the like as a conduction film for preventing oxidation on the most projecting end face 200a of the bump 200, that is the top face of the third aluminum bump 314, as in the aforesaid embodiment.

All of the first, second, and third conductors or only the third aluminum bump 314 may be a conductor such as gold, copper, titanium, tantalum, or the like.

Further, it is also possible to further increase the bump in height by laminating conductive layers by repeating the same processes as those of the fourth layer and the fifth layer by the same procedures.

Third Embodiment
FIG. 5 and FIG. 6A to FIG. 6D

Figure 5:
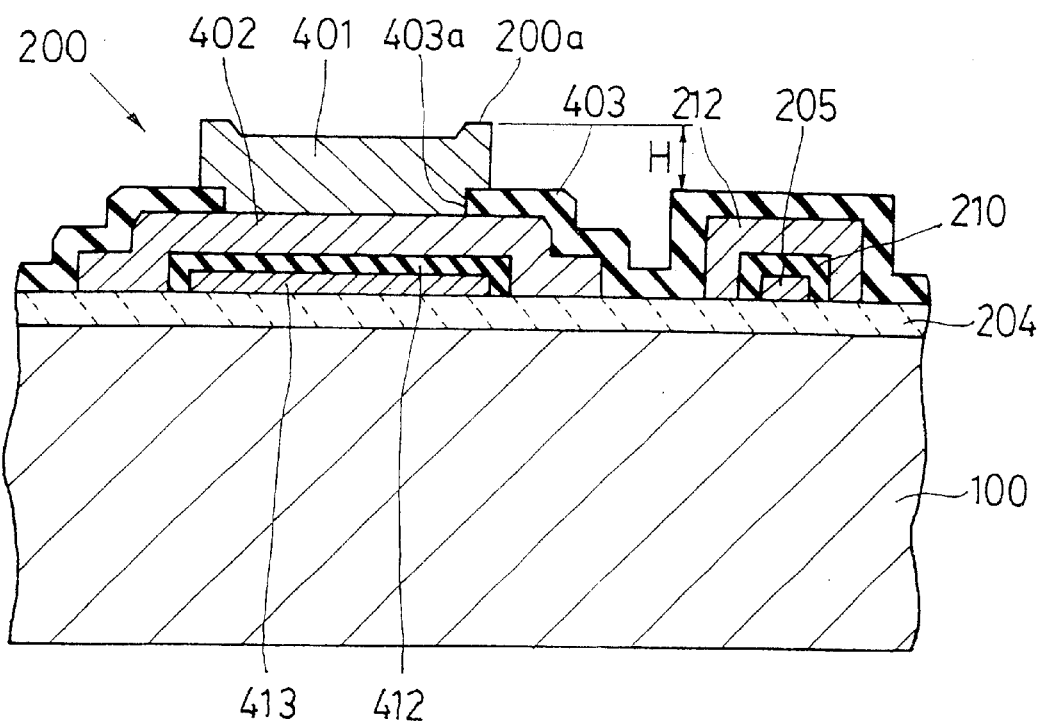
FIG. 5 is a sectional view of a bump and thereabout having a polysilicon layer and a two-layered aluminum structure showing a third embodiment of the semiconductor device according to the present invention.

FIG. 5 is a view similar to FIG. 1, showing the third embodiment of the semiconductor device according to the present invention, and the same numerals and symbols are given to portions corresponding to those in FIG. 1 and the description thereof is omitted.

In this embodiment, the height of a bump is increased by using a polysilicon layer used for an interconnection in the semiconductor device and a gate of a transistor, and an insulation layer on the polysilicon layer.

An under-bump polysilicon layer 413 is formed by depositing the same material as that of a polysilicon layer 205 used for the interconnection in the semiconductor device and the gate of the transistor by sputtering or the like in a vacuum apparatus simultaneously when the polysilicon layer 205 is formed, and normally has a thickness of about 0.5 micron ($\mu$m).

An under-bump insulation layer 412 is an insulation film formed on the under-bump polysilicon layer 413 and formed by practicing heat-treatment to the under-bump polysilicon layer 413 simultaneously with an insulation layer 210 on the polysilicon layer 205, and normally has a thickness of about 0.5 micron ($\mu$m).

A first aluminum layer 402 is also formed by being deposited by sputtering in the vacuum apparatus simultaneously with the aluminum layer 212 for the interconnections in the semiconductor device and normally has a thickness of about 1 micron ($\mu$m).

A passivation film 403 is a protection insulation film is formed for the sake of protecting elements in the semiconductor device and is formed by being deposited in the vacuum apparatus and normally has a thickness of about 0.8 micron ($\mu$m).

A second aluminum bump 401 is a conductor for forming a bump 200 and is also formed by being deposited by sputtering in the vacuum apparatus, and has a thickness of about 2 micron ($\mu$m).

An opening portion 403a in the passivation film 403 is an opening for obtaining conduction between the first aluminum layer 402 which is a conductor and the second aluminum bump 401 for establishing connection to the outside.

The height of a most projecting end face 200a of the bump 200 in this embodiment is a value of the sum of the thickness of the first aluminum layer 402, the thickness of the passivation film 403, the thickness of the second aluminum bump 401, the thickness of the under-bump polysilicon layer 413, and the thickness of the under-bump insulation layer 412. On the other hand, the height of a projecting face of the interconnection portion is a value of the sum of the respective thicknesses of the polysilicon layer 205, the insulation layer 210, the aluminum layer 212, and the passivation film 403, resulting in a difference H in height.

As for the structure of the semiconductor device, if the under-bump polysilicon layer 413 and the under-bump insulation layer 412 are formed also at the bump formation position in the forming step of the polysilicon layer used as the gate of the transistor and the interconnection, in the fabrication process of the semiconductor device, the second aluminum bump 401 can be formed in the same process as that described in the first embodiment.

FIG. 6A to FIG. 6D are sectional views showing the steps of fabricating the bump in the semiconductor device in this embodiment.

Figure 6A:
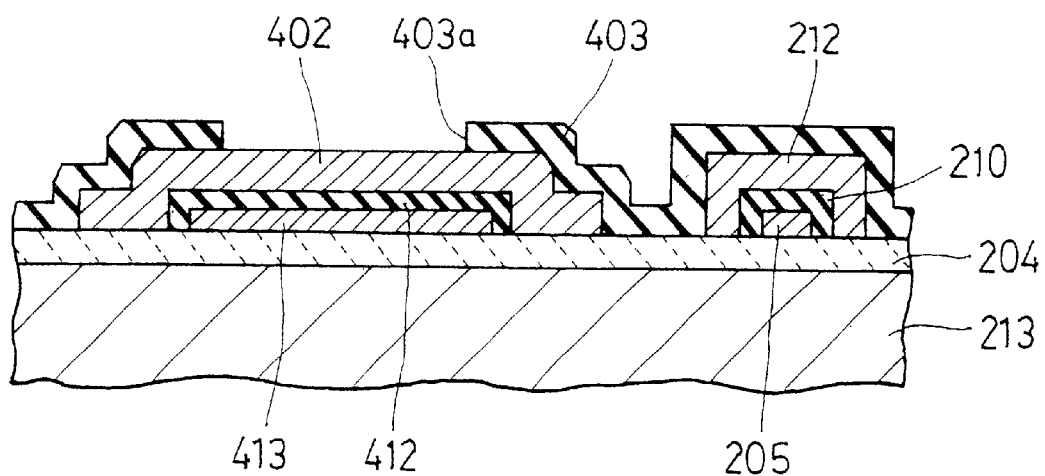
FIG. 6A to FIG. 6D are sectional views showing the fabricating steps of the bump of the semiconductor device.

FIG. 6A is a view showing the sectional structure of a portion that is made in the fabricating steps of the ordinary semiconductor device.

Here, the under-bump polysilicon layer 413, the under-bump insulation layer 412, and the first aluminum layer 402 are respectively formed simultaneously in the steps in which the polysilicon layer 205 necessary for the interconnection in the semiconductor device and the gate of the transistor, the insulation layer 210, and the aluminum layer 212 are formed.

Figure 6B:
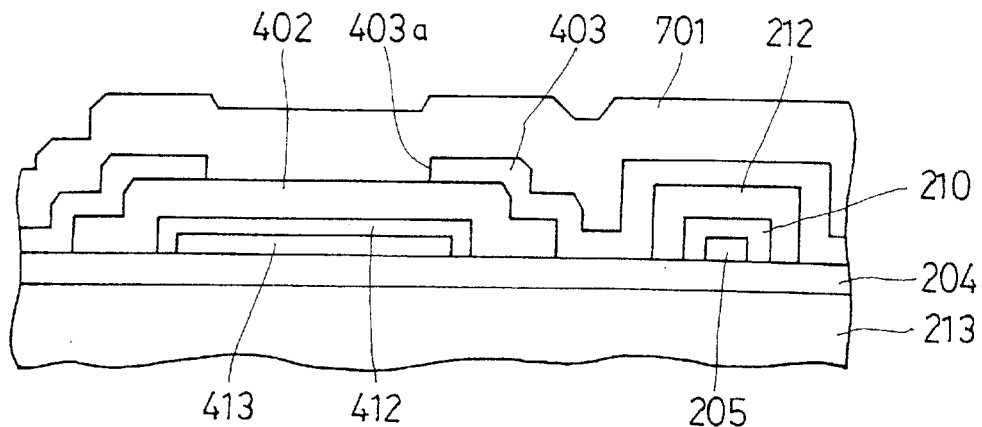

FIG. 6B shows a sectional structure when the surface of the first aluminum layer 402 exposed within the opening portion 403a of the passivation film 403 is subjected to back-sputtering in a vacuum to remove an oxidation film and thereafter a second aluminum layer 701 is laminated by sputtering.

Figure 6C:
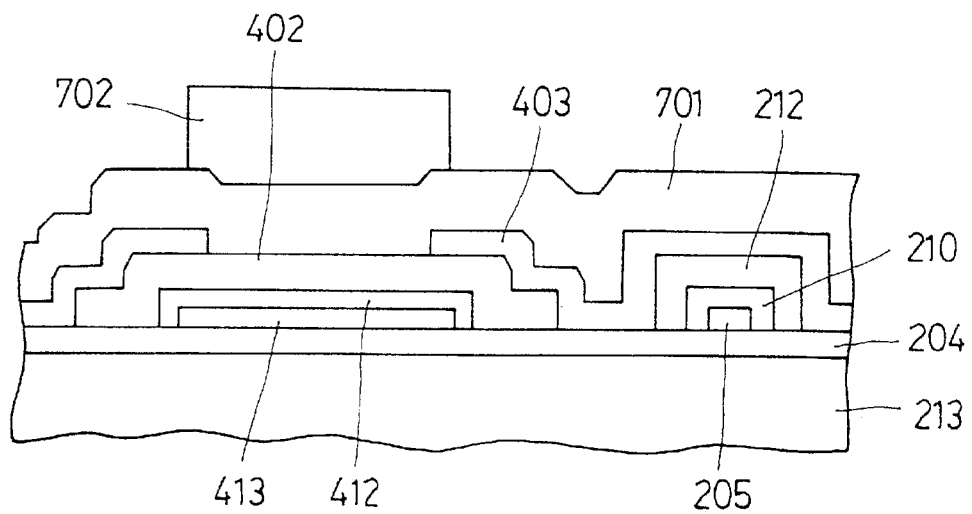

FIG. 6C shows a state where a photoresist 702 is applied on the second aluminum layer 701 in FIG. 6B and patterned to remain only at a bump formation region.

Figure 6D:
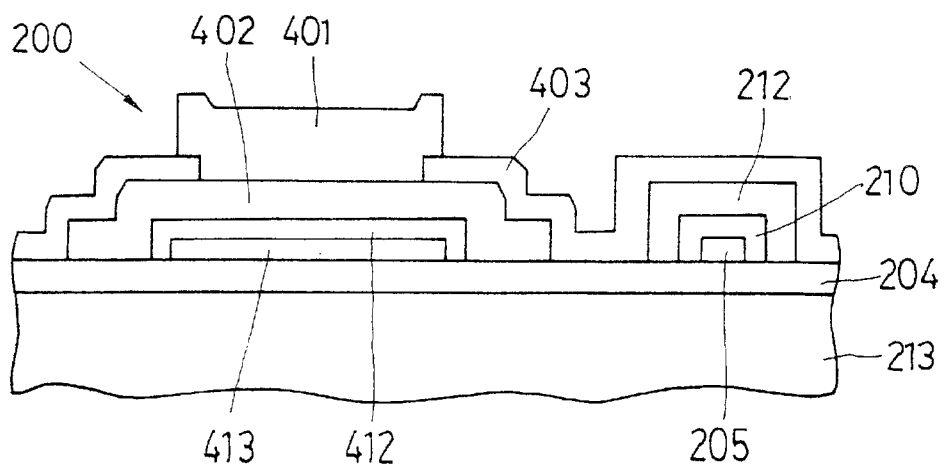

Then, the second aluminum layer 701 is etched with the photoresist 702 as a mask to form the second aluminum bump 401 as shown in FIG. 6D, thereby making up the bump 200.

Thereafter, a silicon wafer 213 is cut and divided into individual semiconductor chips 100, thereby completing the semiconductor device comprising the bumps 200 shown in FIG. 5.

As described above, the fabricating steps of the bump in this embodiment are the same as the fabrication process of the ordinary semiconductor device, and thus it becomes unnecessary to particularly perform the steps of making up the bumps after the division into the semiconductor chips.

Here, in place of aluminum used for the first and second conductors in this embodiment, both of them or only the second conductor may be formed with a conductor such as gold, copper, titanium, tantalum, or the like.

Further, it is preferable to form a conductive film for preventing oxidation such as a transparent conductive film or the like on the most projecting end face 200a of the bump 200.

Fourth Embodiment
FIG. 7 and FIG. 8A to FIG. 8D

Figure 7:
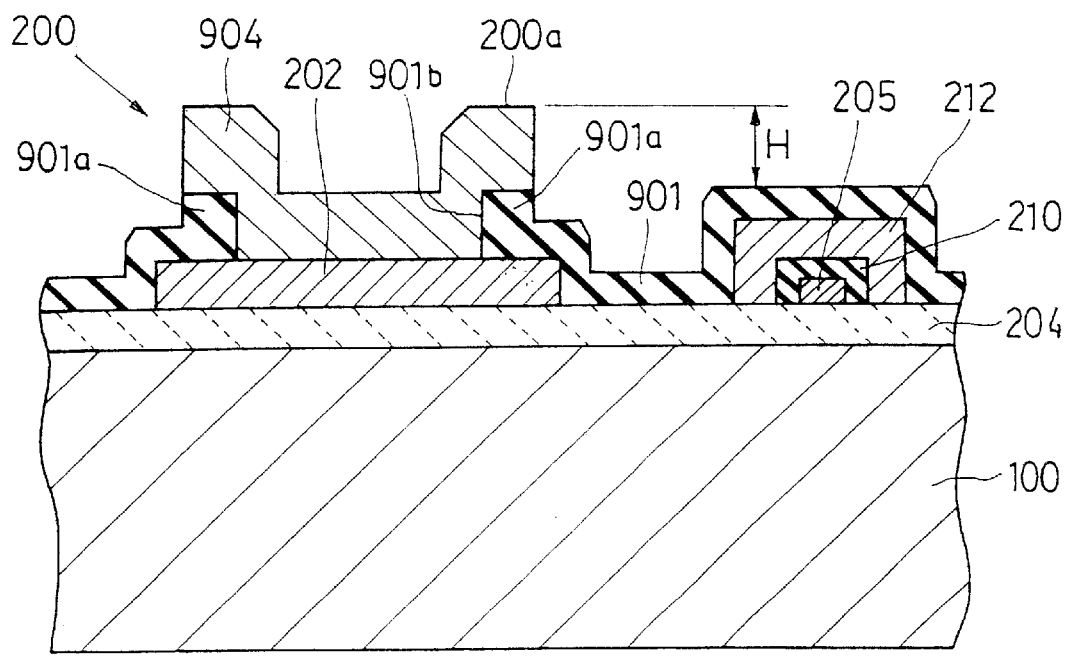
FIG. 7 is a sectional view of a bump and thereabout with a thick passivation film showing a fourth embodiment of the semiconductor device according to the present invention.

FIG. 7 is a view showing a bump and thereabout in the fourth embodiment of the semiconductor device according to the present invention, and the same numerals and symbols are given to portions corresponding to those in FIG. 1 and the description thereof is omitted.

In this embodiment, a passivation film 901 which is a protection insulation film formed for protecting elements in the semiconductor device is formed with a thickness of about 0.8 micron ($\mu$m) at the normal region but with a thickness of about 1.6 micron ($\mu$m), which is twice that at the normal region, at an under-bump region 901a under a second aluminum bump 904 to thereby increase the height of a bump 200.

The second aluminum bump 904 is a conductor for forming the bump 200. The second aluminum bump 904 is formed by being deposited by sputtering in a vacuum apparatus and has a thickness of about 1 micron ($\mu$m).

An opening portion 901b of the passivation film 901 is an opening for establishing connection between a first aluminum layer 202 which is a conductor and the second aluminum bump 904.

The height of a most projecting end face 200a of the bump 200 of the semiconductor device is a value of the sum of the thickness of the first aluminum layer 202, the thickness of the under-bump region 901a of the passivation film 901, and the thickness of the second aluminum bump 904. On the other hand, the height of a projecting face of an interconnection portion is a value of the sum of the thickness of the passivation film 901 at the normal region, the thicknesses of a polysilicon layer 205 and an insulation layer 210, and the thickness of an aluminum layer 212, resulting in a difference H in height of about 0.8 micron ($\mu$m).

FIG. 8A to FIG. 8D are views showing the steps of making up the bump of the semiconductor device of the fourth embodiment.

Figure 8A:
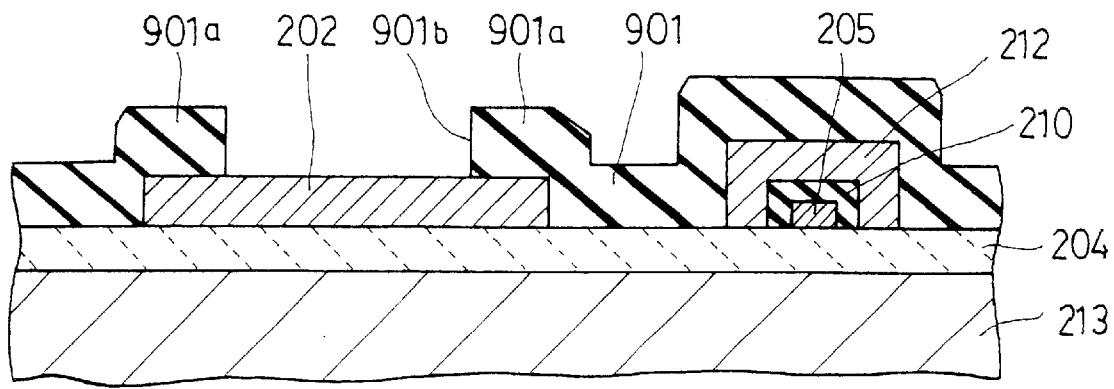
FIG. 8A to FIG. 8D are views of the fabricating steps of the bump of the semiconductor device.

FIG. 8A is a sectional view showing the structure of a portion that is made in the fabrication process of the ordinary semiconductor device.

On a silicon wafer 213, the polysilicon layer 205 for the interconnection necessary for the semiconductor device and the gate of the transistor, the insulation layer 210, and the aluminum layer 212 are formed.

Moreover, the passivation film 901 for circuit protection is formed with a thickness of 1.8 micron ($\mu$m) which is twice the normal thickness.

Figure 8B:
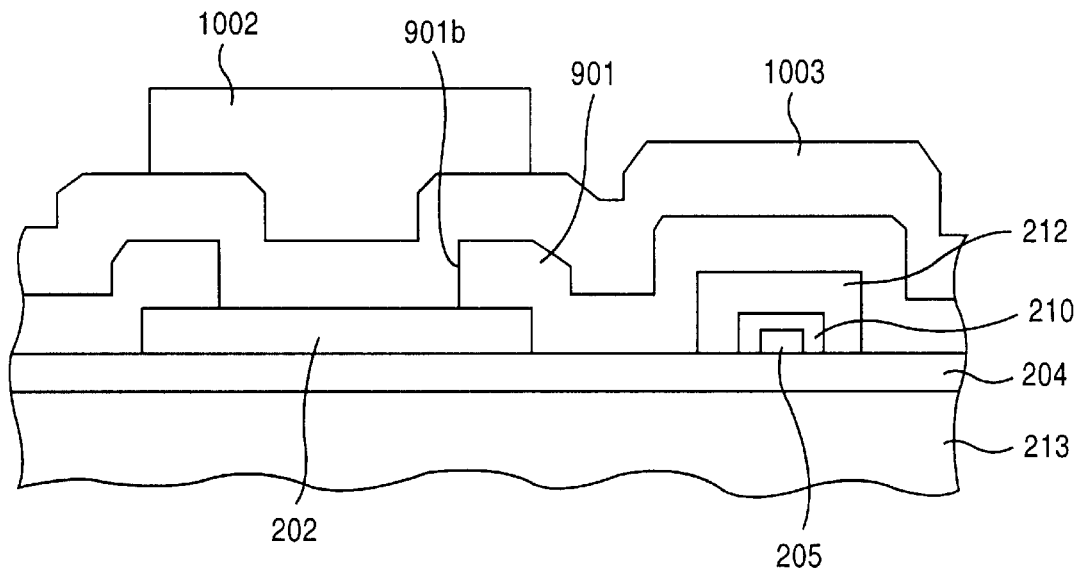

After the surface of the first aluminum layer 202 exposed within the opening portion 901b of the passivation film 901 is subjected to back-sputtering in a vacuum, a second aluminum layer 1003 is formed by being laminated on the entire face by sputtering as shown in FIG. 8B, and a photoresist 1002 is applied on the second aluminum layer 1003 and patterned to remain at a bump formation region.

Figure 8C:
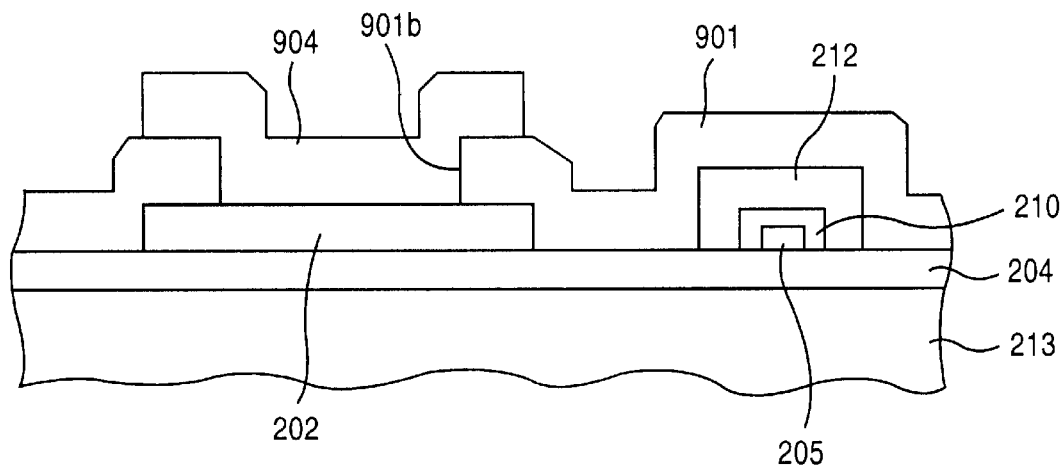
Figure 8D:
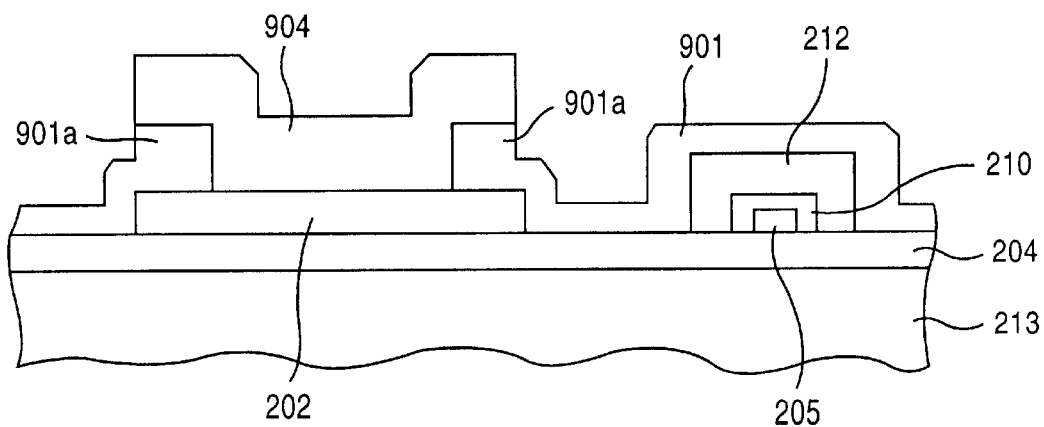

Then, the second aluminum layer 1003 is etched with the photoresist 1002 as a mask to form the second aluminum bump 904 as shown in FIG. 8C.

Thereafter, the passivation film 901 is subjected to dry-etching with the second aluminum bump 904 as a mask by a PI apparatus using a mixed gas of $CF_4$ and $O_2$. At that time, a power supply is reduced in order not to etch the second aluminum bump 904.

By the dry-etching, the passivation film 901 is etched to be about half in thickness except for the region 901 a under the second aluminum bump 904 as shown in 8D.

Thereafter, the silicon wafer 213 is cut and divided into individual semiconductor chips 100, thereby completing the semiconductor device comprising the bumps 200 shown in FIG. 7.

According to this embodiment, since the fabricating steps of the bump thereof is the same as the fabricating process of the ordinary semiconductor device as described above, it is unnecessary to form the bumps after the division into semiconductor chips. In other words, as for this semiconductor device, the bumps thereof can be easily formed in the fabrication process of the ordinary semiconductor device.

Here, in place of aluminum which is used as the first and second conductors in this embodiment, both of them or only the second conductor may be formed with a conductor such as gold, copper, titanium, tantalum, or the like.

Further, it is preferable to form a conductive film for preventing oxidation such as a transparent conductive film or the like on the most projecting end face 200a of the bump 200.

Fifth Embodiment
FIG. 9A to FIG. 9D

The structure of the fifth embodiment which is made so as to prevent an increase in connection resistance of a bump of the semiconductor device according to the present invention due to surface oxidation and the surface processing steps thereof will be explained with FIG. 9A to FIG. 9D.

In this embodiment, the processing steps in the case where the surface of the bump is covered with a transparent conductive film are shown.

FIG. 9A shows a sectional view when back-sputtering is performed for the semiconductor device in which a first aluminum layer 202 and a second aluminum bump 201 are formed on a silicon wafer 213 in a vacuum apparatus as in the aforesaid embodiments to clean the surface of the second aluminum bump 201, and thereafter a transparent conductive film 501 made of ITO is sequentially formed by being laminated on the entire surface by means of the same sputtering apparatus.

FIG. 9B shows a sectional view when a photoresist 510 is applied on the entire surface and patterned by exposure with a metal mask.

Then, the transparent conductive film 501 is etched with a liquid such as an ordinary acid with the photoresist 510 as a mask, thereby removing the transparent conductive film 501 except for a bump formation region as shown in FIG. 9C.

Then, the photoresist 510 is removed, which brings about a state where the top face of the second aluminum bump 201 forming the uppermost portion of the bump and the surroundings thereof are completely covered with the transparent conductive film 501 as shown in FIG. 9D, thereby preventing conduction resistance from increasing due to oxidation of the surface of the second aluminum bump 201.

The formation of the transparent conductive film at least on the most projecting end face of the bump is applicable to any one of the second to fourth embodiments.

In place of the transparent conductive film made of ITO, a metal film of gold, copper, titanium, tantalum, or the like may be formed to cover the end face of the bump as a conductive film for preventing oxidation.

According to the present invention, a semiconductor device comprising bumps that are uniform in height and have a sufficient difference in height can be fabricated at low cost.

Figure 10:
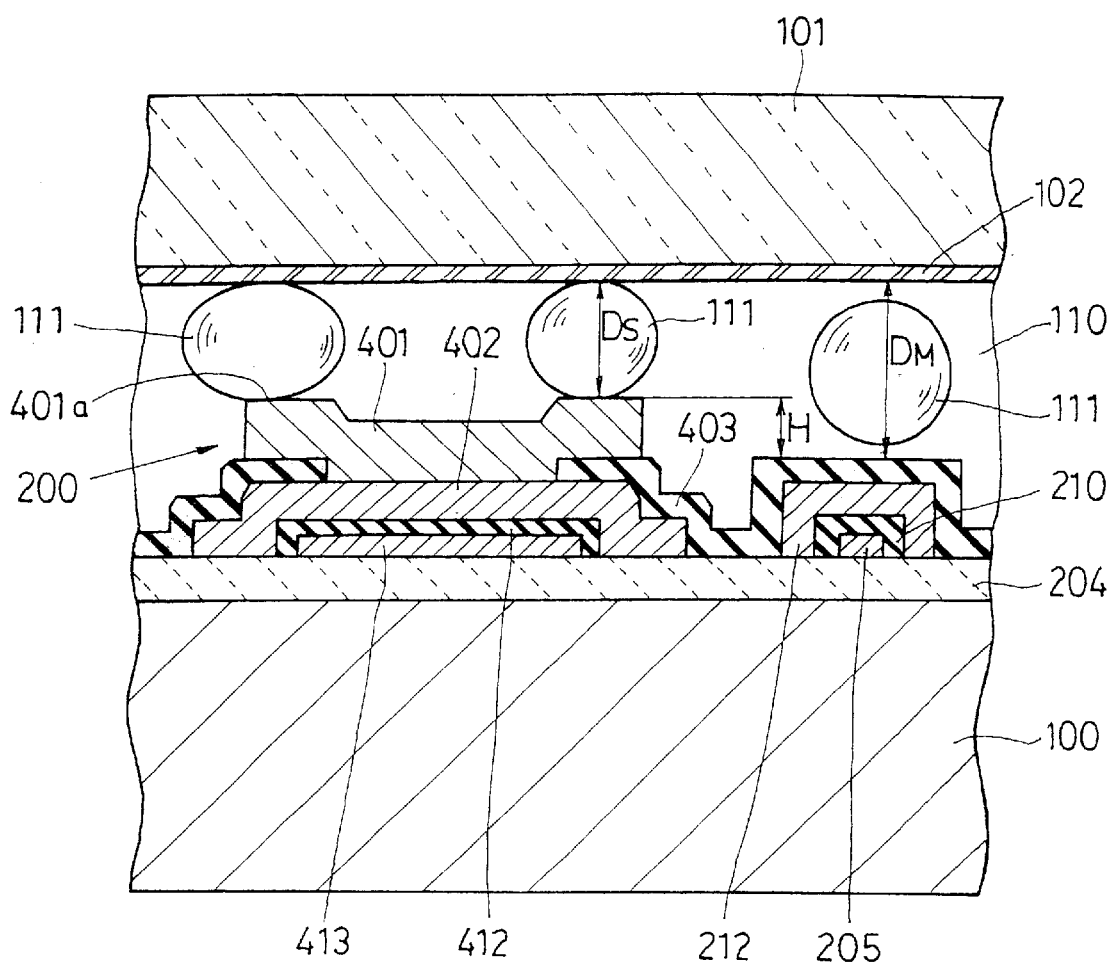
FIG. 10 is a sectional view of a principal portion showing an example of a structure of the semiconductor device according to the present invention mounted on the substrate.
Figure 11:
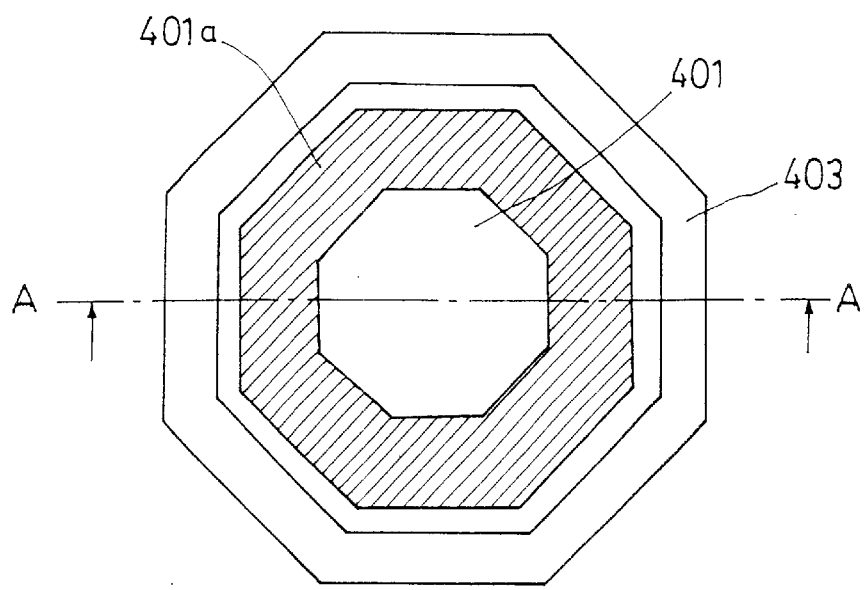
FIG. 11 is a plane view of a bump and a protection insulation film shown in FIG. 10.

Sixth Embodiment
FIG. 10 and FIG. 11

Next, the embodiment in the case of mounting the semiconductor device according to the present invention on a circuit board using an anisotropic conductive film will be explained.

FIG. 10 and FIG. 11 explain the semiconductor device of the aforesaid third embodiment of the present invention by an example of the case of mounting it on a glass substrate of a liquid crystal display panel. FIG. 11 is a plane view of the bump 200 and the surroundings thereof, and FIG. 10 is a sectional view along an A—A line in FIG. 11.

The semiconductor chip 100 on which the bumps 200 are formed is mounted on a substrate 101 with an anisotropic conductive film (ACF) 110 therebetween.

The substrate 101 is not limited to the glass substrate but a circuit board such as a PCB or the like is acceptable. On the surface of the substrate 101, an electrode 102 is formed with a transparent conductive film (ITO or the like), copper foil, or the like.

Many conductive particles 111 are dispersed in the ACF, and the semiconductor chip 100 is positioned with respect to the substrate 101 holding the ACF therebetween and is heated while being pressed, whereby the conductive particles are sandwiched between the electrode 102 and the bumps 200, and become deformed to be slightly flattened so as to electrically connect them.

When the minimum diameter of the conductive particles is $D_S$ and the maximum diameter thereof is $D_M$, it is desirable that the difference between the most projecting end face of the bump 200 and other projecting faces is the difference between the minimum diameter $D_S$ and the maximum diameter $D_M$ (an error in diameter of the conductive particles) or more.

The second aluminum bump 401 is an aluminum layer which is the center of the bump 200. The height of the second aluminum bump 401 is higher than that of the interconnection portion that is the next highest face in this semiconductor device by only the H. If this difference in height is small, it becomes impossible that the electrode 102 and the second aluminum bump 401 connect each other through the conductive particles 111 having the minimum diameter because of the particles having the maximum diameter sandwiched between the electrode 102 and the interconnection portion.

On the other hand, in order to increase the height of the bump 200, the lamination time and the etching time for the second aluminum bump 401 get longer, which results in not only increased cost but also cracks and strains due to stress after the formation. In other words, it is important to make the bump to the required but minimum height.

In this embodiment, the second aluminum bump 401 is formed so as to be larger in height than the difference between the maximum conductive particle diameter and the minimum conductive particle diameter. More specifically, in the case where the minimum conductive particle diameter is 3 $\mu$m and the maximum conductive particle diameter is 5 $\mu$m, the difference H in height is made larger than 2 $\mu$m that is the above difference to connect the electrode 102 and the second aluminum bump 401 without fail.

Seventh Embodiment

FIG. 12

Figure 12:
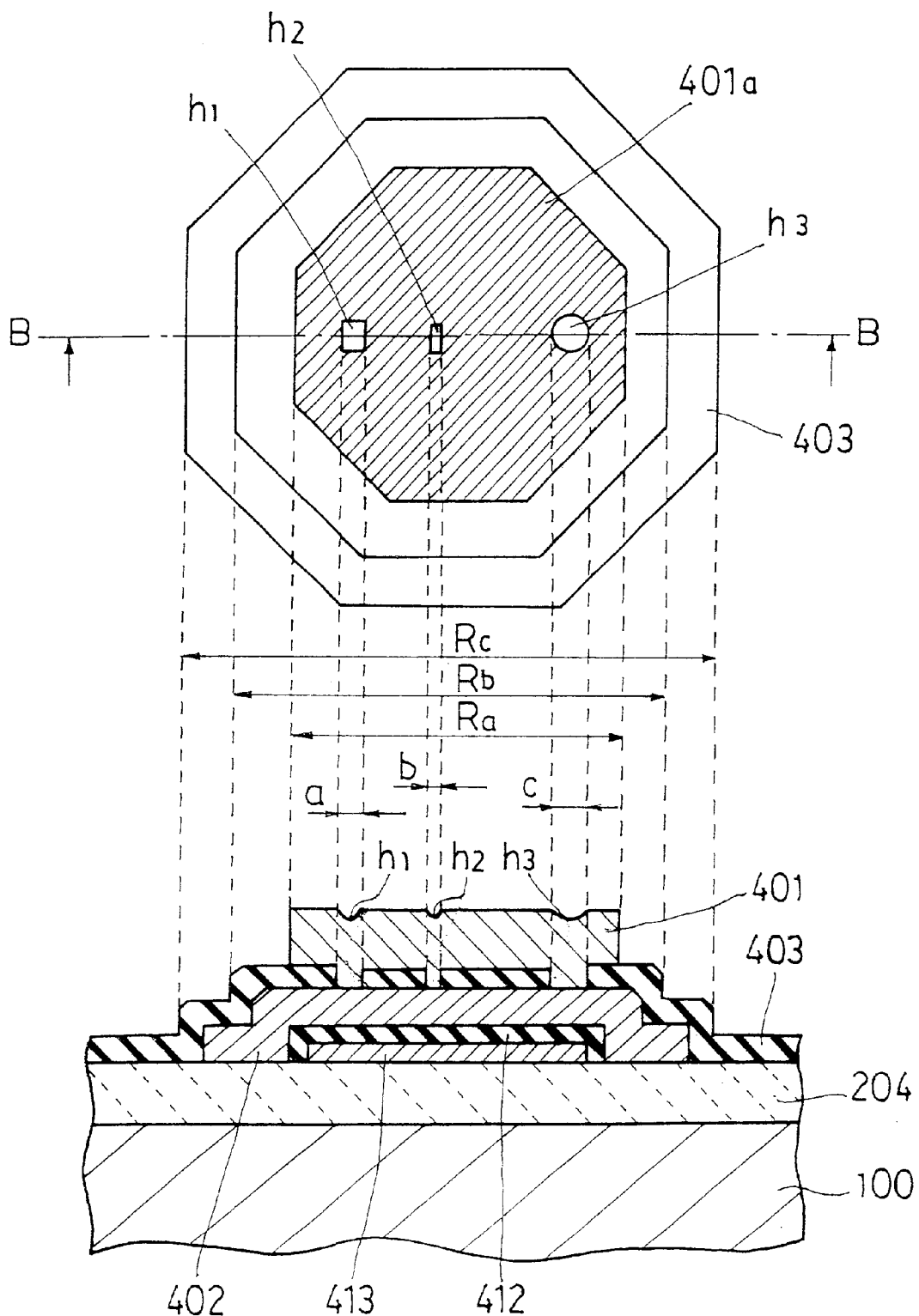
FIG. 12 is a view in which a plane view and a sectional view of a bump and thereabout are corresponding with each other in a sixth embodiment of the semiconductor device according to the present invention.

Next, the embodiment in the case where the connection effective region is increased in area by improving the passivation opening is described. FIG. 12 is a plane view of the case where the bump shape is an octagon and a sectional view along a B—B line thereof.

In the drawing, illustrated on the upper side is the plane view of this embodiment. An Ra corresponds to a diameter of a step that the second aluminum bump 401 forms. An Rb shows a diameter of a step caused by a step that the thickness of the polysilicon layer 413 and the under-bump insulation layer 412 form. An Rc shows a diameter of a step caused by a step that the first aluminum layer 402 forms.

An h1 shows a square opening portion of the passivation, an h2 is a rectangular opening portion of the passivation, and an h3 is a circle opening portion of the passivation. A PV diameter "a" is a length of a side of the opening h1, a PV diameter "b" is the smallest diameter of the opening h2, and a PV diameter "c" is a length of the opening h3 diameter.

The PV diameter "a" and the PV diameter "c" are shorter than 1.5 times the minimum conductive particle diameter Ds in FIG. 10. Only one conductive particle enters any PV openings even in the worst case.

In the case of the rectangle such as the opening h2 with the PV diameter "b", the longer side is made 1.5 times less than the minimum conductive particle diameter Ds, whereby no more than one minimum conductive particle enters it. For example, when the minimum conductive particle diameter Ds is 3 $\mu$m, the opening h2 with the PV diameter "b" is made into a rectangle smaller than 4.5 $\mu$m×4.5 $\mu$m.

Moreover, the shape of the PV opening may be a circle or an ellipse though it is not shown. In that case, the long axis (the diameter in the case of a circle) is shorter in length than 1.5 times the minimum conductive particle diameter Ds.

The connection effective region becomes larger in area by a decrease in area of the PV opening portion by this invention, resulting in easy connection with the electrode on the substrate. In other words, the region necessary for the bump electrode can be small in area as compared with that in the conventional structure.

Since the ordinary conductive particle is 2 $\mu$m to 5 $\mu$m, the region of the PV opening portion is 3 $\mu$m×3 $\mu$m to 7.5 $\mu$m×7.5 $\mu$m or less, but the connection with the first aluminum layer 402 thereunder with low resistance has been experimentally checked.

It should be noted that the conventional region is a region that is formed according to the structure shown in the conventional example, and thus the description thereof is omitted. Further, this embodiment is an example in which the bump electrode is fabricated using the interconnections in the integrated circuit, the polysilicon layer used for the transistor gate, and the insulation layer on the polysilicon layer according to Japanese Patent Application No. Hei 10-43140, and also the remaining structure in Japanese Patent Application No. Hei 10-43140 can be similarly used.

Eighth Embodiment

FIG. 13

Figure 13:
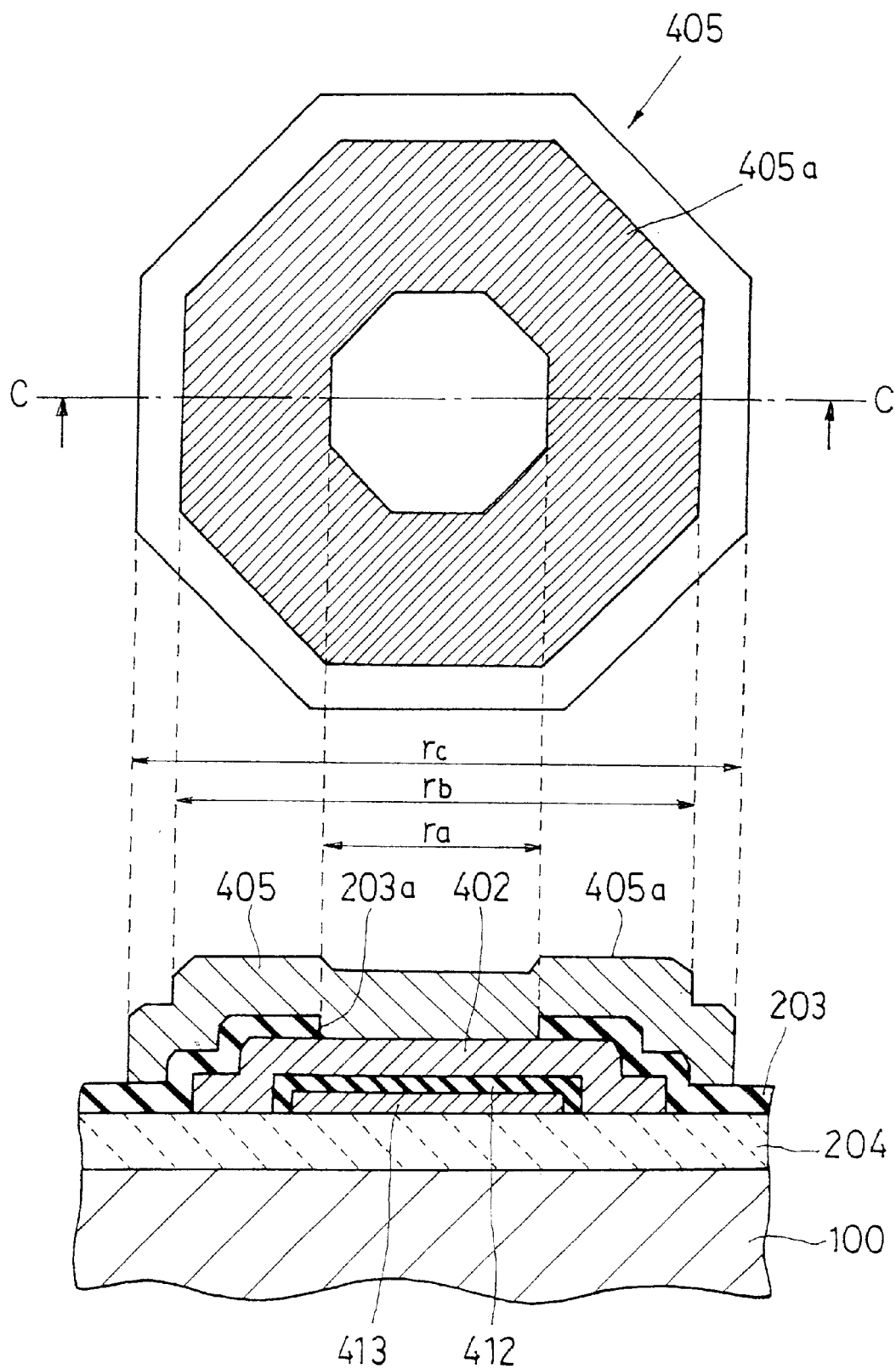
FIG. 13 is a view in which a plane view and a sectional view of a bump and thereabout are corresponding with each other in a seventh embodiment of the semiconductor device according to the present invention.
Figure 14A:
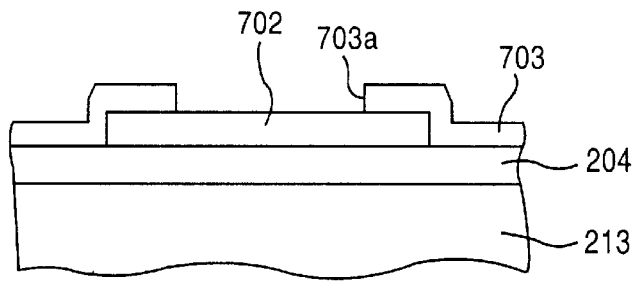
FIG. 14A to FIG. 14D are sectional views showing the fabricating steps and the structure of a bump in a conventional semiconductor device.
Figure 14B:
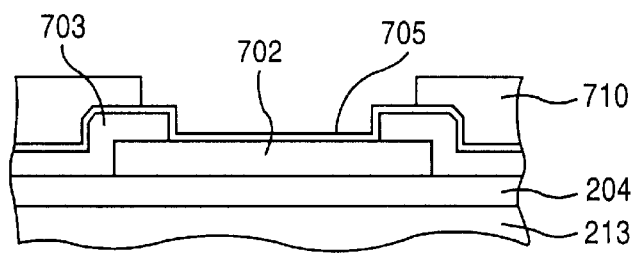
Figure 14C:
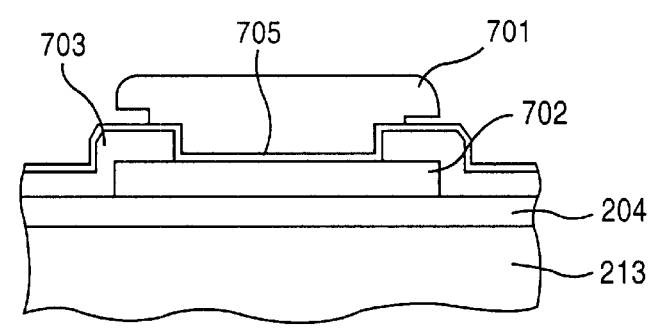
Figure 14D:
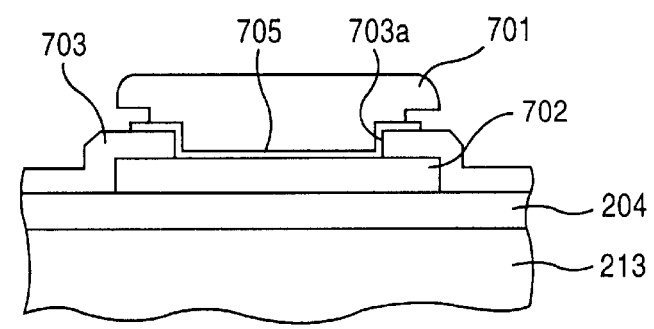

Next, an embodiment in which the connection effective region is increased in area by increasing a region of a second aluminum bump 405 is explained. FIG. 13 is a sectional view and a plane view in the case where the bump is octagon in shape. In the drawing, illustrated on the upper side is a plane view of this embodiment. A diameter "ra" shows a diameter of a step that the thickness of an under-polysilicon layer 413 and an under-bump insulation layer 412 form. A diameter "rb" corresponds to a diameter of a step that the second aluminum bump 405 forms. A diameter "rc" shows a diameter of a step caused by the passivation opening portion 203a.

The second aluminum bump 405 is formed in such a manner to cover all the steps that are made up for the bump formation. Therefore, a connection effective region 405a becomes larger in area compared with the conventional one, resulting in easy connection between the integrated circuit and the electrode on the substrate. In other words, the region necessary for the bump electrode can be smaller in area compared with that in the conventional structure.

The structure of the second aluminum bump 405 covering all the steps is described in this embodiment, but it is natural to employ the structure covering only the first level. More specifically, the structure of covering the first step from the highest position of the second aluminum bump 405, whereby its object can be achieved.

The connection effective region increases in area by the combination of the aforesaid first, second, and third embodiments, resulting in a bump electrode with certainty and reliability for the ACF mounting.

INDUSTRIAL APPLICABILITY

As has been described, as for the semiconductor device according to the present invention, the integrated circuit comprising the bumps that surely connect the electrodes on the substrate in the ACF mounting and are stable in structure can be fabricated at low cost.

What is claimed is:

1. A semiconductor device comprising a polysilicon layer used for an interconnection and a gate of a transistor, an insulation layer covering the polysilicon layer, an interconnection conductor layer formed on the insulation layer, and a bump for inputting and outputting a power supply or a signal to an integrated circuit, on a surface of a semiconductor chip in which the integrated circuit is formed, wherein a polysilicon film and an insulation film made of the same materials as those of said polysilicon layer and said insulation layer, respectively, are provided at a region at which said bump is to be formed, on the surface of said semiconductor chip;

a first conductor which covers the insulation film and is electrically connected to said interconnection conductor layer is made of the same material as that of said interconnection conductor layer by sputtering;

a protection insulation film which covers surfaces of the first conductor, said interconnection conductor layer, and said semiconductor chip and in which an opening portion is provided on the first conductor is formed; and a second conductor which conducts to the first conductor through the opening portion is formed on the protection insulation film by sputtering, and wherein said bump is composed of the polysilicon film, the insulation film, the first conductor, and the second conductor, and is formed so that a height of a most projecting end face thereof from the surface of said semiconductor chip is higher than those of projecting faces of any other parts.

2. The semiconductor device according to claim 1, wherein each of said first conductor and said second conductor is made of aluminum.

3. The semiconductor device according to claim 1, wherein the most projecting end face of said bump is covered with a conductive film for preventing surface oxidation.

4. A semiconductor device comprising a bump, on a surface of a semiconductor chip in which an integrated circuit is formed, for inputting and outputting a power supply or a signal to the integrated circuit, wherein on the surface of said semiconductor chip, a first conductor which is electrically connected to said integrated circuit;

a protection insulation film which covers surfaces of the first conductor and said semiconductor chip and in which an opening portion is formed on the first conductor; and a second conductor which is formed on the protection insulation film by sputtering and conducts to the first conductor through the opening portion, are provided, and wherein the protection insulation film is formed in such a manner that the film thickness at a region under the second conductor is thicker than at a different region, and said bump is composed of the first conductor and the second conductor and is formed so that a height of a most projecting end face thereof from the surface of said semiconductor chip is higher than those of projecting faces of any other parts.

5. The semiconductor device according to claim 4, wherein each of said first conductor and said second conductor is made of aluminum.

6. The semiconductor device according to claim 4, wherein the most projecting end face of said bump is covered with a conductive film for preventing surface oxidation.

7. A semiconductor device comprising a bump, on a surface of a semiconductor chip in which an integrated circuit is formed, for inputting and outputting a power supply or a signal to the integrated circuit, and mounted on a substrate with an anisotropic conductive film containing a large number of conductive particles therebetween, wherein on the surface of said semiconductor chip, a first conductor which is electrically connected to said integrated circuit;

a protection insulation film which covers surfaces of the first conductor and said semiconductor chip and in which a through hole is formed on the first conductor; and a second conductor which is formed on the protection insulation film by sputtering and conducts to the first conductor through the through hole, are provided, and wherein said bump is composed of the first conductor and the second conductor, and is formed so that a height of a most projecting end face thereof from the surface of said semiconductor chip is higher than those of projecting faces of any other parts by an error in diameter of the large number of conductive particles contained in said anisotropic conductive film or more.

8. The semiconductor device according to claim 7, wherein a maximum opening dimension of the through hole formed in said protection insulation film is within 1.5 times a minimum diameter of the large number of conductive particles contained in said anisotropic conductive film.

9. The semiconductor device according to claim 7, wherein the through hole formed in the protection insulation film is composed of one in any one shape of a square, a rectangle, a polygon, a circle, or an ellipse, or ones in a plurality of shapes out of these.

10. The semiconductor device according to claim 7, wherein the second conductor is formed in an area larger than a region within which a step is formed at the protection insulation film caused by a step of the first conductor.

11. The semiconductor device according to claim 7, wherein the most projecting end face of said bump is covered with a conductive film for preventing surface oxidation.

* * * * *